(12) United States Patent
Lilienthal, II

(10) Patent No.: US 6,338,591 B1
(45) Date of Patent: Jan. 15, 2002

(54) REMOVABLE, SPRING BIASED FASTENER

(75) Inventor: Peter F. Lilienthal, II, Princeton, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/465,129

(22) Filed: Dec. 16, 1999

Related U.S. Application Data

(63) Continuation-in-part of application No. 09/309,943, filed on May 11, 1999.

(51) Int. Cl.$^7$ .............. B25G 3/18; F16B 21/00; F16D 1/00
(52) U.S. Cl. .............. 403/326; 24/453; 403/322.1
(58) Field of Search .............. 403/321, 322.1, 403/322.4, 325, 326, 329, 330; 24/296, 453, 606, 607

(56) References Cited

U.S. PATENT DOCUMENTS

| | | | | |
|---|---|---|---|---|
| 3,368,182 A | * | 2/1968 | Culver | 339/91 |
| 3,422,502 A | * | 1/1969 | McCarthy | 24/123 |
| 3,574,367 A | * | 4/1971 | Jankowski | 287/54 |
| 3,817,005 A | * | 6/1974 | Rannfeld | 403/329 |
| 5,464,298 A | * | 11/1995 | Schomakers | 403/252 |
| 5,725,324 A | * | 3/1998 | Pavelski | 403/321 |
| 5,803,646 A | * | 9/1998 | Weihrauch | 403/290 |

* cited by examiner

*Primary Examiner*—Lynne H. Browne
*Assistant Examiner*—John B. Walsh
(74) *Attorney, Agent, or Firm*—Michael Y. Epstein

(57) ABSTRACT

A spring biased mechanical fastener comprises two side-by-side first rods fixedly secured at first ends to an end support. The two first rods terminate in two oppositely facing detents, and each rod includes a V-bent camming surface. A horizontal bar mounted on the end of a second bar slidably mounted though the end support engages and drives the camming surfaces. Forced sliding movements of the second bar relative to the two first rods causes elastic flexure of the two rods for moving the two detents towards one another for reduced lateral extent and for passage through an opening through objects fastened together by the fastener.

9 Claims, 2 Drawing Sheets

REMOVABLE, SPRING BIASED FASTENER

This is a Continuation-in-part of prior application Ser. No. 09/309,943, filed May 11, 1999.

BACKGROUND OF THE INVENTION

This invention relates to mechanical fasteners, and particularly to spring-biased fasteners removable by access to but one end of the fastener.

Self-locking fasteners providing an axial clamping function upon lateral expansion of spring-biased front end portions of the fasteners are known. One advantage of such fasteners is that they can be inserted into blind openings, i.e., where the front end of the inserted fastener is not accessible, and clamped in place upon the release of spring-biased, laterally extended latching elements. A problem with such fasteners is that, in the absence of access to the sprung latching elements at the fastener front end, they are generally difficult to remove and, when removable, generally require a large removing force.

The present invention is a fastener which can be, with access to but one end of the fastener, easily secured in place and removed.

SUMMARY OF THE INVENTION

A fastener having an axis of elongation comprises a pair of side-by-side, axially extending and coextensive cantilevered first rods secured at first ends to an end support for preventing lateral movements of the first rods except by spring flexure of the rods. The end support comprises a first, laterally extending latching surface. The rods terminate in respective oppositely facing detents which, in combination, form a second latching surface axially spaced from the first latching surface and having a lateral extent greater than that of the two side-by-side rods. Preferably, the axial spacing between the two latching surfaces precisely matches the thickness of the objects being fastened together.

A second rod having a first end forming one end of the fastener is slidably mounted through the end support and has a second end including a cam for interaction with cam surfaces on the two first rods for causing flexure of the two first rods. Either direction movement of the second rod causes flexure of the two rods in directions for reducing the lateral extent of the two detents.

In use, the detent end of the fastener is axially aligned with and pressed into an opening extending entirely through objects to be secured together. Initially, the lateral extent of the second latching surface provided by the two laterally extending detents is greater than the diameter of the opening and prevents entry of the leading end of the fastener into the opening.

With continued axially inward pressure on the accessible first end of the second rod and attendant axial movement of the second rod cam relative to the cam surfaces on the first rods, flexure of the first rods occurs for reducing the lateral extent of the two detents until the detents pass into and through the opening. Once the detents are through the opening, the flexed first rods force the detents apart for locking the fastener in place.

For removing the fastener, the second end of the second rod is pulled axially outwardly for, initially, flexing the two first rods in directions for reducing the lateral extent of the two detents to a size less than the diameter of the opening through the fastened together objects. Continued outward pulling on the second rod then pulls the fastener through the opening for easy removal of the fastener.

DESCRIPTION OF THE DRAWING

The drawings are not necessarily to scale and, except for FIGS. 1 and 2, are schematic.

DESCRIPTION OF PREFERRED EMBODIMENTS OF THE INVENTION

Figure 1:
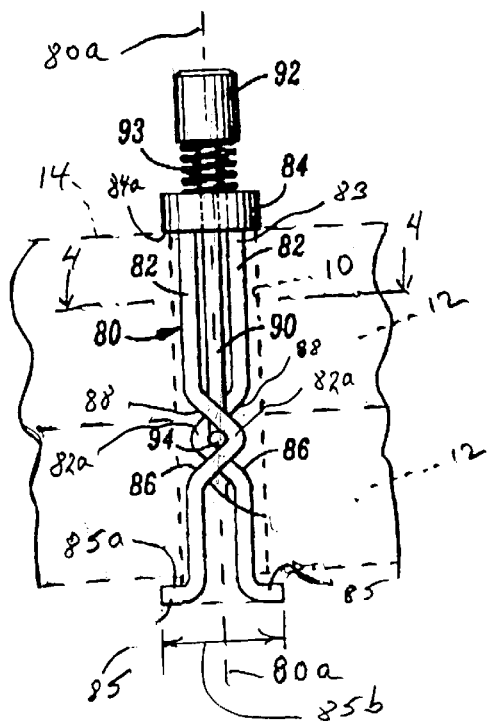
FIGS. 1 and 2 are side elevational views, at right angles to one another, showing a fastener according to a first embodiment of the present invention and also showing, in dashed lines, two objects secured together by the fastener.
Figure 2:
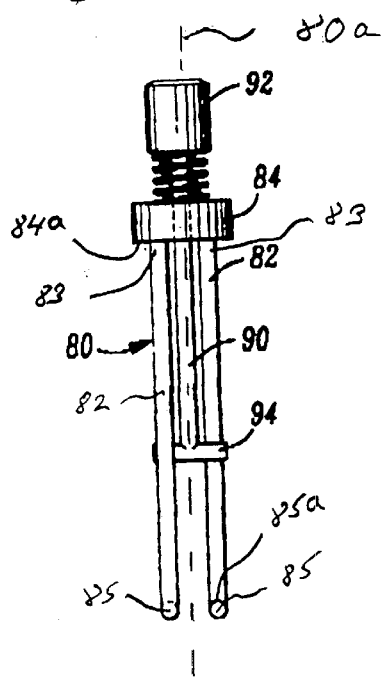

A fastener 80, in accordance with one embodiment of the invention, comprises, as shown in FIGS. 1 and 2, two relatively stiff and elastic rods 82, preferably of a spring metal, such as steel, aluminum or brass, or of a plastic material such as ABS, nylon or polycarbonate. The two rods 82 are co-extensive and generally parallel to an axis 80a of elongation of the fastener.

First ends 83 of the two rods 82 are rigidly secured within a common support 84, e.g., a short circular cylinder of steel or ABS, having a flat bottom surface 84a extending perpendicular to the fastener axis 80a and serving, as hereinafter described, as a first latching element surface (i.e., against a surface of an object being fastened by the fastener). The rods 82 are sufficiently rigid such that no relative movements between the two rods occur except as a result of controlled flexure of the rods.

Second ends of the two rods 82 are laterally bent to provide oppositely directed detents 85. As described hereinafter, the two detents serve, in combination, as a spring-biased, second latching element of the fastener 80. In FIG. 1, the two rods 82 are in unflexed condition and the combined lateral extent of the two detents 85 is generally equal to the diameter of the support 84. FIG. 1 shows the fastener 80 disposed through an aligned opening 10 through two flat objects 12 being secured together by the fastener. The lateral extents of the support 84 and of the two detents 85 are greater than the diameter of the opening 10.

The two rods 82 are generally parallel, but each rod includes, intermediate the ends thereof, a V-bent section 82a having two inclined surfaces 86 and 88. Each rod 82, including the V-bent section 82a and the detent 85 thereon, lies in a plane spaced from and parallel to the plane of the other rod 82. The inclined surfaces 86 and 88 serve as cam surfaces and are effective, as hereinafter described, for causing controlled flexure of the two rods 82 for controlling the positioning of the two detents 85 relative to one another.

The cam for driving the surfaces 86 and 88 part of a control element of the fastener comprising is a laterally extending horizontal bar 94 disposed at the end of an axially extending camming rod 90. The rod 90 is slidably mounted through the support 84 to which the two rods 82 are secured. The upper end 92 of the rod 90 is enlarged to facilitate grasping thereof by the fingers of a user of the fastener and to additionally serve as a stop for a coiled spring 93 mounted around the rod 90 between the enlarged end 92 and the support 84.

The length of the camming rod 90 is such that when the coiled spring 93 is not compressed, the horizontal bar 94 at the end of the rod 90 is disposed (FIG. 1) precisely opposite to the "bottoms" of the V-sections 82a of the two rods 82 (by "bottom" being meant the intersection of the two inclined surfaces 86 and 88 of each V-section 82a). Also (FIG. 2) the horizontal bar 94 extends laterally to, and slightly beyond, each rod 82. With the cam bar 94 so positioned, the rods 82 are not significantly flexed and the detents 85 are maximally spaced apart. By "not significantly flexed" is meant that the horizontal bar 94 preferably, as shown in FIGS. 1 and 2, is in slight compressive engagement with the rods 82 to provide a degree of stiffening of the body of the fastener.

While mounting and removing the fastener 10, as now to be described, requires axial movements of the camming rod 90 relative to the rods 82, rotation of the camming rod 90 is preferably avoided. Such rotation can be prevented, for example, by the use of an adequately stiff rod 90 having a non-circular (e.g., square or rectangular) cross-section at least where the rod 90 passes through a correspondingly shaped passageway through the support 84.

As noted, FIG. 1 shows, in dashed lines, a pair of flat objects 12 fastened together by the fastener 80. Although the fastener can be used as a general purpose fastener, e.g., made available in a variety of dimensions for selective use in a variety of applications, a preferred use of the fastener is in an application where the dimensions of the fastener 80 match those of the objects 12 being fastened together. Thus, in FIG. 1, the two objects 12 have a combined thickness generally matching the distance between the two latching elements of the fastener, i.e., the support 84 and the detents 85. Also, the two objects 12 include a pair of aligned through openings 10 of an inner diameter (at least at the upper and lower surfaces of the objects) slightly less than the lateral extents of the support 84 and the two detents but larger than the maximum lateral extent of the fastener structure between the support 84 and the two detents 85.

Accordingly, when the fastener is first, say, picked up by hand and placed in (as herein illustrated) vertical alignment with the opening 10 through the objects 12, the combined lateral extent of the two detents prevents entry of the fastener into the opening 10. However, by pressing downwardly against the enlarged end 92 of the camming rod 90, while the detents 85 are pressing against the upper surface 14 of the upper object 12, the rod 90 is forced axially downwardly relative to the rods 82 and the horizontal bar 94 at the end of the rod 90 presses downwardly against the inclined surfaces 86 of the V-sections 82a of the two rods 82. This causes lateral movements of the two rods for resiliently flexing the rods in directions moving the two detents 85 towards one another. With continued downward force against the rod 90, the fastener enters into the opening 10 when the lateral extent of the two detents is sufficiently reduced. This is illustrated in FIG. 3 where the squeezed together detents 85 are shown passing downwardly through the opening 10 through the objects 12.

Downward (in the illustrative example) pushing of the fastener 80 through the opening 10 is continued until the bottom surface 84a of the support 84 (the "first" latching surface) engages the upper surface 14 of the upper object 12. Such surface to surface engagement of the fastener against the object provides a quite positive tactile signal to the user that the fastener has been fully inserted and that downward pressure against the enlarged end 92 of the rod 90 can be stopped. At this time, the detents 85 at the leading end of the fastener have emerged from the opening 10 and, with released downward pressure on the rod 90 and the horizontal bar cam 94, the spring bias of the flexed rods 82 functions to straighten the rods 82 for moving the detents 85 apart from one another to the position shown in FIG. 1 for locking the fastener in place.

Figure 3:
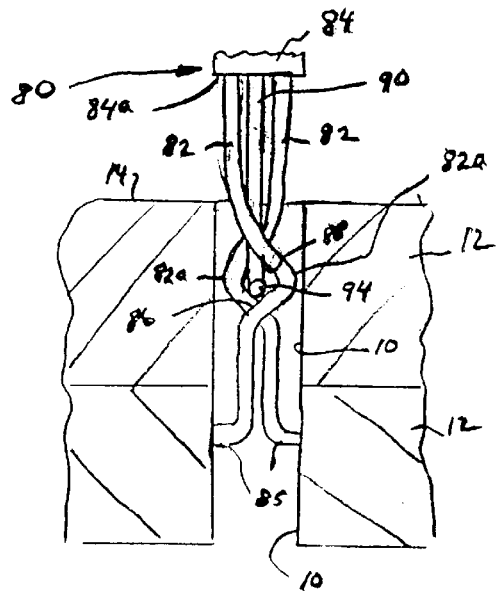
FIG. 3 is a partial view of the fastener shown in FIG. 1 as the fastener is being passed through an opening through two objects being secured together.

Such locking of the fastener in place, and the attendant straightening of the rods 82, is possible only if the horizontal bar 94, downwardly moved during the fastener insertion process shown in FIG. 3, is upwardly moved out of the way of the straightening rods 82. Such movement is accomplished partly in response to the spring pressure of the flexed rods 82 and partly by the coiled spring 93 which had been compressed when the rod 90 was forced downwardly towards the support 84 during insertion of the fastener.

When the fastener is fully inserted and the detents sprung free, as shown in FIG. 1, the two objects are clamped together between the latching surfaces provided by the detents 85 and the support 84.

As noted, full fastener insertion is signaled by contact of the support 84 against the objects 12. Vision of the detent end of the fastener is not needed. Likewise, neither vision of nor access to the detent end of the fastener is required for removal of the fastener. This is accomplished by pulling upwardly on the enlarged end 92 of the camming rod 90. Initially, the contact between the detents 85 and the bottom surface of the fastened objects prevents upward movement of the fastener, and the camming rod 94 begins to be raised relative to the rods 82. The raised horizontal bar cam 94 is forced against the inclined surfaces 88 of the V-sections 82a of the two rods 82, and the two rods 82 are again flexed in directions causing lateral movements of the detents 85 towards one another for reducing the lateral extent of the two detents. When the lateral extent is small enough, the detents are pulled upwardly through the opening upon continued upward pulling on the end 92 of the fastener.

As described, either direction forced movements of the camming rod 90 relative to the rods 82 results in reduction in the lateral extent of the two detents. This allows pushing on the fastener end 92 for fastener insertion and locking and pulling on the end 92 for fastener removal.

In the foregoing described embodiment, axial movements of the cam bar 94 against the pairs of inclined surfaces 86 or 88 of the two rods 82 force the two rods 82 in opposite directions, i.e., towards one another. The rods 82 thus exert oppositely directed forces on the opposite ends of the cam bar 94. From FIG. 2, it is seen that the left-hand rod 82 exerts a force tending to push the left end of the bar 94 into the plane of the drawing while the right-hand rod 82 exerts a force tending to push the right end of the bar 94 out of the plane of the drawing. The two oppositely directed forces thus tend to rotate the camming rod 90 about its axis. This is generally undesirable, as affecting the interaction between the bar 94 and the inclined surfaces 86 and 88. As previously described, excessive rotation of the camming rod 90 is avoided by making it of adequately large diameter and stiffness and, preferably, of square cross-section where it passes through the support 84.

Figure 5:
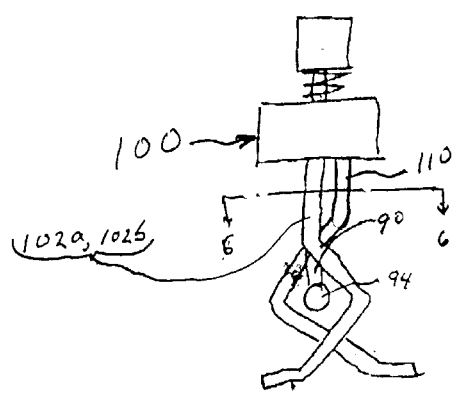
FIGS. 5 and 6 are views similar to FIGS. 1 and 4, respectively, but showing a second embodiment of the invention.
Figure 6:
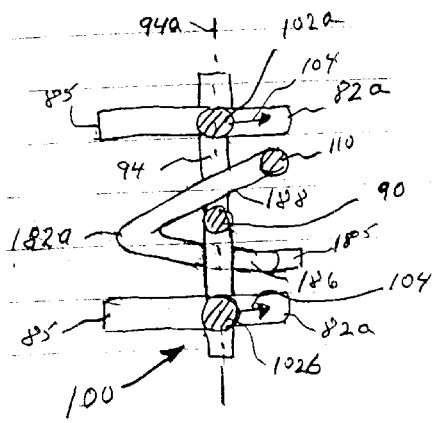

A fastener 100, in accordance with a second embodiment of the invention, is shown in FIGS. 5 and 6 and includes means for further reducing rotation of the camming rod 90.

The fastener 100 is generally identical in structure and function to the fastener 80 shown in FIGS. 1–3 except that it includes three rods 102a, 102b and 110 flexed in response to axial movements of a cam bar 94 rather than the two rods 82 in the fastener 80.

Figure 4:
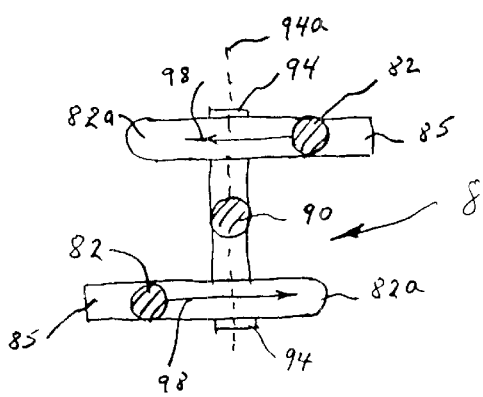
FIG. 4 is a sectional view of the fastener taken along line 4—4 in FIG. 1.

For more readily explaining the differences in structure between the two fasteners 80 and 100, reference is first made to FIG. 4, which is a sectional view along the vertical axis 80a of the fastener 80 looking towards the detents 85. As shown, the two detents 85 at the ends of the two rods 82 extend in opposite directions relative to the horizontal cam bar 94 and (see, also FIG. 1) the V-sections 82a of the two rods 82 loop around the bar 94 also in opposite directions. As previously explained, axial movements of the cam bar 94 relative to the rods 82 tend to push the rods 82 towards one another, as shown by the arrows 98 in FIG. 4, and the oppositely directed forces of the rods 82 against opposite ends of the bar 94 tend to cause (as viewed in FIG. 4) clockwise rotation of the bar 94 around the axis 82a of the camming rod 90.

In the fastener 100 shown in FIGS. 5 and 6, two rods 102a and 102b are provided generally similar to the rods 82 of the fastener 80 except, as shown most clearly in FIG. 6, the detents 85 at the ends of the rods 102a and 102b extend in the same direction relative to the cam bar 94 and, significantly, the V-sections 82a of the two rods 102a and 102b loop around the bar 94 in the same direction (i.e., to the right in FIG. 5). In the fastener 100, as in the fastener 80, axial movements of the cam bar 94 relative to the rods 102a and 102b tend to cause flexure of the rods 102a and 102b, but in the same direction, as indicated by the arrows 104 in FIG. 6. The same direction forces of the rods 102a and 102b at opposite ends of the cam rod 94 cancel one another with respect to causing rotation of the rod 94 around the axis of the rod 90.

(Another difference between the fasteners 80 and 100 is that the rods 82 in the fastener 80 are disposed (FIG. 4) on opposite sides of the cam bar 94. In the fastener 100, the two rods 102a and 102b are (FIG. 6) in line with the axis 94a of bar 94. This difference in design is a matter of choice, and, in the fastener 80, the two rods 82 can be, if desired, disposed along (FIG. 4) the axis 94a of the bar 94 while still looping in opposite directions around the bar 94. Similarly, in the fastener 100, the two rods 102a and 102b can be disposed (FIG. 6) off-axis of the bar 94—but still on the same side of the bar 94 and looping in the same direction around the bar 94.)

In the fastener 100, the detents 85 of the rods 102a and 102b extend in the same direction (to the left in FIG. 6), and for the fastener 100 to function similarly to the fastener 80, an additional detent extending oppositely to the detents of the rods 102a and 102b is required. This is provided by the aforementioned third rod 110 of the fastener 100. As shown in FIG. 6, the third rod 110 is disposed off-axis from the two rods 102a and 102b and to the right of the horizontal bar 94. The rod 110 includes a V-bent section 182a which loops to the left around the bar 94, and terminates in a detent 185 extending to the right of the bar 94 and in a direction opposite to the detents 85 of the rods 102a and 102b.

The V-bent section 182a of the rod 110 includes inclined surfaces 186 and 188 which interact with the horizontal bar 94 to cause movements of the detent 185 of the rod 110 in directions opposite to the corresponding movements of the detents 85 of the rods 102a and 102b. Thus, the functioning of the fastener 110 is similar to that of the fastener 80.

Interaction of the inclined surfaces 186 and 188 of the rod 110 with the horizontal bar 94 does tend to cause rotation of the bar 94 around the axis of the rod 90. However, by looping the V-bent section 182 of the rod 110 around the horizontal bar 94 at positions quite close to the bar 90, as shown in FIG. 6, the turning force, or torque, against the bar 94 by the inclined surfaces 186 and 188 of the rod 110 is quite minimal. (Note that the inclined surface 188 of the V-bent section 82a of the rod 110 must be spaced from the rod 90 in order to pass by the rod 90; hence some bar 94 turning torque is caused by interaction of the inclined surface 188 with the bar 94. Conversely, the inclined surface 186 of the rod 110 can be disposed to loop directly beneath the rod 90, hence no bar 94 turning force would be caused by interaction of the inclined surface 186 with the bar 94.)

Figure 7:
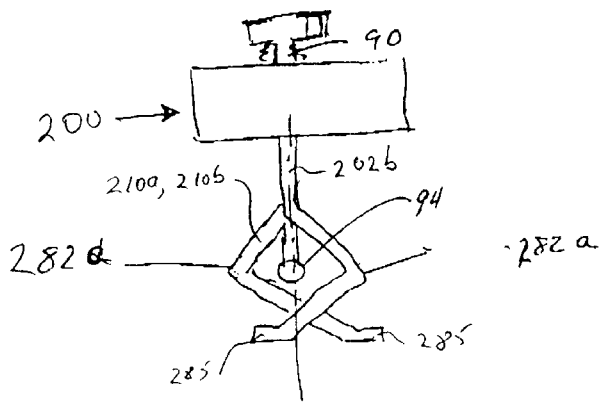
FIGS. 7 and 8 are views similar to FIGS. 5 and 6, respectively, but showing a third embodiment of the invention.
Figure 8:
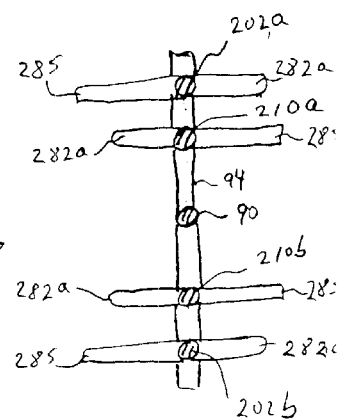

A fastener 200 in accordance with a third embodiment of the invention is shown in FIGS. 7 and 8. Quite simply, the fastener 200 is identical to the fastener 100 shown in FIGS. 5 and 6 in that the fastener 200 includes two rods 282a and 282b identical to the rods 102a and 102b of the fastener 100. Thus, the rod 94 turning forces produced by the rods 282a and 282b cancel one another. The third rod 110 in the fastener 100 is replaced with two rods 210a and 210b. The two rods 210a and 210b are otherwise identical to the two rods 202a and 202b but extend in opposite directions and provide two detents 285 extending in directions opposite to the detents 285 of the two rods 202a and 202b. Also the rod 94 turning forces of the two rods 210a and 210b cancel one another. In effect, the fastener 200 functions identically to the fastener 80 shown in FIGS. 1–4, but with a pair of rods 282a, 282b or 210a, 210b functioning as each rod 82 in the fastener 80. However, no net rod 94 turning forces are present.

What is claimed is:

1. A fastener comprising a pair of side-by-side, axially extending first rods terminating, at a second end of the fastener, in respective laterally extending detents together forming a second latching element having a variable lateral extent, a first latching element disposed adjacent to a first end of the fastener, and a control element axially moveable relative to said rods for causing, in response to said relative axial movements of said control element, elastic flexure of said rods for causing changes in the lateral extent of said second latching element, said first rods being rigidly secured to a support member forming said first latching element, said control element comprising a second rod slidably mounted through said support member and having a first end including a cam operably engaged with laterally inclined camming surfaces on said first rods, said second rod having a second end spaced from said support member and comprising said second end of the fastener, said camming surfaces on each of said first rods comprising a V-bend along each of said rods, said first rods and respective V-bends therealong lying in respective spaced apart parallel planes, and said control element cam comprising a bar extending laterally between and through said planes.

2. A fastener comprising a pair of side-by-side, axially extending first rods terminating, at a second end of the fastener, in respective laterally extending detents together forming a portion of a second latching element having a variable lateral extent, a first latching element disposed adjacent to a first end of the fastener, and a control element axially moveable relative to said rods for causing, in response to said relative axial movements of said control element, elastic flexure of said rods for causing changes in the lateral extent of said second latching element, said first rods being rigidly secured to a support member forming said first latching element, said control element comprising a second rod slidably mounted through said support member and having a first end including a cam operably engaged with laterally inclined camming surfaces on said rods, said second rod being disposed between said pair of first rods, said control element cam comprising a cam bar extending laterally of said second rod in opposite directions therefrom towards and into engagement with respective said first rods, each of said firsts rods engaging said cam bar at opposite ends thereof and exerting, during said relative axial movements of said control element second rod, oppositely directed turning torques on said bar ends for a zero net turning torque.

3. A fastener according to claim 2 including a third rod operably similar to said first rods disposed between said first rods and terminating in a detent extending in a lateral direction opposite to that of the detents on said first rods.

4. A fastener according to claim 2 including a second pair of first rods substantially identical to the first named pair of first rods and exerting, during said relative axial movements of said second rod, oppositely directed turning torques on said cam bar for a zero net turning torque, each of said second pair of first rods terminating in respective detents extending in a lateral direction opposite to that of the detents of said first pair of first rods.

5. A fastener of fixedly interconnected parts including a pair of side-by-side, axially extending first rods terminating, at a second end of the fastener, in respective laterally extending detents together forming a second latching element having a variable lateral extent, a first latching element disposed adjacent to a first end of the fastener, and a control element axially moveable relative to said rods for causing elastic flexure of said rods for causing changes in the lateral extent of said second latching element.

6. A fastener according to claim 5 wherein said control element comprises a cam engaged with laterally inclined camming surfaces on said first rods.

7. A fastener according to claim 6 wherein said first rods are rigidly secured to a support member forming said first latching element, and said control element comprises a second rod slidably mounted through said support member and having a first end spaced from said support member and comprising said first end of the fastener.

8. A fastener according to claim 7 wherein said camming surfaces on each of said first rods comprise a V-bend along each of said rods, the two first rods and respective V-bends therealong lie in respective spaced apart parallel planes, and said control element cam comprises a bar extending laterally between and through said planes.

9. A fastener according to claim 5 wherein, for axial movement of said control element in either direction relative to said first rods, a reduction in the lateral extent of said second latching element occurs.

* * * * *